(12) United States Patent
Price et al.

(10) Patent No.: US 11,659,669 B2
(45) Date of Patent: May 23, 2023

(54) MULTI-STEP INTEGRATED CIRCUIT HANDLING PROCESS AND APPARATUS

(71) Applicant: PRAGMATIC PRINTING LTD., Sedgefield (GB)

(72) Inventors: Richard Price, Sedgefield Durham (GB); Stephen Devenport, Sedgefield Durham (GB); Brian Cobb, Sedgefield Durham (GB)

(73) Assignee: PRAGMATIC PRINTING LTD., Sedgefield (GB)

( * ) Notice: Subject to any disclaimer, the term of this patent is extended or adjusted under 35 U.S.C. 154(b) by 437 days.

(21) Appl. No.: 16/641,720

(22) PCT Filed: Aug. 16, 2018

(86) PCT No.: PCT/GB2018/052326
§ 371 (c)(1),
(2) Date: Feb. 25, 2020

(87) PCT Pub. No.: WO2019/043354
PCT Pub. Date: Mar. 7, 2019

(65) Prior Publication Data
US 2020/0359508 A1 Nov. 12, 2020

(30) Foreign Application Priority Data
Aug. 30, 2017 (GB) ..................... 1713883

(51) Int. Cl.
*H05K 3/46* (2006.01)
*H05K 3/36* (2006.01)
(Continued)

(52) U.S. Cl.
CPC .......... *H05K 3/4632* (2013.01); *H05K 3/361* (2013.01); *B29C 65/1403* (2013.01); *B29L 2031/3425* (2013.01)

(58) Field of Classification Search
CPC ......... B29C 65/1403; B29L 2031/3425; H01L 21/6835; H01L 21/6836; H01L 2221/68322
See application file for complete search history.

(56) References Cited

U.S. PATENT DOCUMENTS

2007/0128767 A1 6/2007 Nakamura
2007/0128774 A1 6/2007 Yamada
(Continued)

FOREIGN PATENT DOCUMENTS

CN 101859728 A 10/2010
CN 102097439 A 6/2011
(Continued)

OTHER PUBLICATIONS

International Preliminary Report on Patentability for International Application No. PCT/GB2018/052326, dated Mar. 12, 2020.
(Continued)

*Primary Examiner* — Minh N Trinh
(74) *Attorney, Agent, or Firm* — Jason H. Vick; Sheridan Ross, PC

(57) ABSTRACT

One exemplary aspect relates to a process and apparatus for selectively changing adhesion strength between a flexible substrate and a carrier at specific locations to facilitate shipping and subsequent removal of the flexible substrate from the carrier. The process includes providing a flexible substrate comprising a plurality of integrated circuits thereon providing a carrier for the flexible substrate and adhering the flexible substrate to the carrier by creating an interface between the flexible substrate and the carrier. The process further includes changing the adhesion force between the flexible substrate and the carrier at selected locations by non-uniform treatment of the interface between the flexible substrate and the carrier with an electromagnetic radiation source (e.g. a laser, flashlamp, high powered LED,
(Continued)

an infrared radiation source or the like) so as to decrease or increase the adhesion force between a portion of the flexible substrate and the carrier at the selected location.

12 Claims, 5 Drawing Sheets

(51) Int. Cl.
*B29C 65/14* (2006.01)
*B29L 31/34* (2006.01)

(56) References Cited

U.S. PATENT DOCUMENTS

| | | |
|---|---|---|
| 2010/0258543 A1 | 10/2010 | Mizuno et al. |
| 2014/0106542 A1 | 4/2014 | Chowdhury et al. |
| 2015/0097203 A1 | 4/2015 | Imangholi et al. |
| 2018/0261446 A1 | 9/2018 | Du |
| 2020/0359508 A1* | 11/2020 | Price .................... H05K 3/4632 |
| 2021/0036034 A1* | 2/2021 | Price .................... H01L 21/6836 |

FOREIGN PATENT DOCUMENTS

| | | |
|---|---|---|
| CN | 106910678 A | 6/2017 |
| CN | 106920779 A | 7/2017 |
| DE | 102016202548 B3 | 8/2017 |
| JP | 2011-003613 A | 1/2011 |
| TW | 201042720 A | 12/2010 |
| WO | WO 2011/151457 | 12/2011 |
| WO | WO 2016/168341 | 10/2016 |

OTHER PUBLICATIONS

Examination Report Under Section 18(3) for Great Britain Patent Application No. 1713883.5, dated Oct. 19, 2021.
International Search Report for International Application No. PCT/GB2018/052326, dated Dec. 6, 2018.
Written Opinion for International Application No. PCT/GB2018/052326, dated Dec. 6, 2018.
Search Report, for Great Britain Patent Application No. 1713883.5, dated Feb. 26, 2018.
Notification of First Office Action (Including Translation) for Corresponding Chinese Patent Application No. 201880056880.0, dated Feb. 18, 2023.

* cited by examiner

MULTI-STEP INTEGRATED CIRCUIT HANDLING PROCESS AND APPARATUS

CROSS REFERENCE TO RELATED APPLICATIONS

This application is a national stage application under 35 U.S.C. 371 of PCT Application No. PCT/GB2018/052326, having an international filing date of 16 Aug. 2018, which designated the United States, which PCT application claimed the benefit of Great Britain Application No. 1713883.5, filed 30 Aug. 2017, each of which are incorporated herein by reference in their entirety.

FIELD

This invention relates to a process and apparatus for manufacturing and handling integrated circuits (ICs). In particular, though not exclusively, the invention relates to a process and apparatus for selectively changing adhesion strength between a flexible substrate and a carrier at specific locations in order to facilitate shipping and subsequent removal of the flexible substrate from the carrier.

BACKGROUND

Current wafer integration techniques involve placing a wafer, typically of crystallised silicon, on an adhesive film on a large wafer frame. The wafer is diced before being placed into an integration machine under tension to create spaces between adjacent dies. During handling of the resulting integrated circuit (IC), a single die may then be picked up or displaced from the adhesive film and either placed directly onto a first support having corresponding contact pads during the formation of an electronic circuit, or if orientation flipping is required placed onto a second pick tool before placement onto the said support having corresponding contact pads.

In processes using a flexible plastic substrate as opposed to a silicon wafer, the same process can be accomplished, with an additional step of a release process from an initial carrier (e.g. glass, polycarbonate or quartz), supporting the flexible plastic substrate, prior to the transfer of the plastic substrate to the adhesive film. This process of removal from the glass carrier results in an array of diced flexible ICs in a format that has sufficient adhesion for shipment and handling on the glass carrier, whilst also allowing for a vacuum head to remove individual flexible ICs from the adhesive film during subsequent handling.

Release processes for a flexible plastic substrate, on which the electronics (e.g. integrated circuits) are laid, from the carrier (e.g. glass, polycarbonate or quartz) typically involve treatment from the backside of the carrier with an electromagnetic radiation source (e.g. a laser, flashlamp, high powered LED, an infrared radiation source or the like). The mechanism will depend on whether the electromagnetic radiation source causes predominantly a photonic ablation (through absorption) or a thermal process (e.g. heat-release). Optionally an adhesive/release material can be employed between the carrier and the flexible plastic substrate. The laser is scanned at fixed, discrete intervals across the surface. The laser modifies the interface between the flexible plastic substrate (e.g. a film) and the glass carrier, either by local ablation of a thin layer of substrate, or by reducing bond strength. Control of the laser to achieve this balanced release in a uniform manner have proven difficult with a narrow process window.

The present invention seeks to avoid the additional handling involved in the transfer step of the flexible plastic substrate from the glass carrier to an adhesive film and the related costs of manufacture.

A balance of adhesion strength is required, matching both conditions of being sufficient to prevent loss of ICs during shipping and handling, but also sufficiently low to allow the pick head to remove the IC dies from the carrier (e.g. rigid or flexible).

The present invention provides at least an alternative to wafer integration techniques of the prior art.

BRIEF SUMMARY OF THE DISCLOSURE

In accordance with the present invention there is provided a process for selectively changing adhesion strength between a flexible substrate, comprising a plurality of electronic components (integrated circuits (ICs)) each comprising a respective group of terminals, and a carrier at specific locations in order to facilitate shipping and subsequent transfer of the flexible substrate, comprising a plurality of electronic components, directly from the carrier onto a respective first portion comprising a respective group of contact pads (contacts), the process comprising the steps of:
providing a flexible substrate comprising a plurality of integrated circuits thereon;
providing a carrier for the flexible substrate and adhering the flexible substrate to the carrier by creating an interface between the flexible substrate and the carrier;
changing the adhesion force between the flexible substrate and the carrier at one or more selected locations by non-uniform treatment of the interface between the flexible substrate and the carrier with an electromagnetic radiation source (e.g. a laser, flashlamp, high powered LED, an infrared radiation source, an ultraviolet radiation source or the like) so as to decrease or increase the adhesion force between a portion of the flexible substrate and the carrier at the selected location(s).

In certain embodiments, the carrier is rigid. More specifically, the carrier is glass, polycarbonate or quartz.

In certain embodiments, the carrier is flexible. More specifically, the carrier is a flexible release tape. More specifically, the release tape may be a uv release tape (available from Nitto Group).

In certain embodiments, the non-uniform treatment reduces the adhesion force between the flexible substrate and the carrier at the selected location(s).

In certain embodiments, the non-uniform treatment increases the adhesion force between the flexible substrate and the carrier at the selected location(s).

In certain embodiments wherein the non-uniform treatment reduces the adhesion force between the flexible substrate and the carrier at the selected location(s), the adhesion force between the flexible substrate and the carrier in the remaining areas (i.e. the untreated areas making up the area other than the selected location(s)) is sufficient to retain contact between the substrate and the carrier during storage and handling and to allow removal of the flexible substrate directly from the carrier during an IC transfer process. More specifically, the adhesion force between the flexible substrate and the carrier in the remaining, untreated areas allows removal of the flexible substrate directly from the carrier onto the first portion comprising the respective groups of contact pads during an IC transfer process. In this way, there is no need for an intervening step wherein the flexible substrate is removed from the carrier onto an adhesive tape prior to the IC transfer process. The ICs are transferred directly from the carrier onto the first portion thereby forming the electronic circuit.

In certain embodiments wherein the non-uniform treatment increases the adhesion force between the flexible substrate and the carrier at the selected location(s), the adhesion force between the flexible substrate and the carrier in the selected location(s) is sufficient to retain contact between the substrate and the carrier during storage and handling and to allow removal of the flexible substrate from the carrier during an IC transfer process.

In certain embodiments, following the step of non-uniform treatment of the interface between the flexible substrate and the carrier so as to increase the adhesion force between the flexible substrate and the carrier at the selected location(s), the method may further comprise a subsequent step of uniformly treating the interface between the flexible substrate and the carrier with an electromagnetic radiation source (e.g. a laser, flashlamp, high powered LED, an ultraviolet radiation source or the like) so as to decrease the adhesion force between the flexible substrate and the carrier in all areas or in the remaining areas except the selected location(s). More specifically, a defocussed electromagnetic radiation source (e.g. an ultraviolet radiation source or the like) is uniformly applied to the interface so as to decrease the adhesion force between the flexible substrate and the carrier in all but the selected location(s). Such a release step is particularly preferred in embodiments wherein the carrier is flexible.

In certain embodiments, the non-uniform treatment increases the adhesion force between the flexible substrate and the carrier in at least one part of the flexible substrate comprising an IC and reduces the adhesion force between the flexible substrate and the carrier in at least one further part of the flexible substrate comprising the same IC. In this way, changes in the treatment of selected areas of the flexible substrate provides regions of low adhesion combined with areas of higher adhesion between the flexible substrate and the carrier, allowing for precise control over the overall adhesion of an individual IC to the carrier.

In certain embodiments, the non-uniform treatment of the interface between the flexible substrate and the carrier with an electromagnetic radiation source (e.g. a laser, flashlamp, high powered LED, an infrared radiation source, an ultraviolet radiation source or the like) increases adhesion between the flexible substrate and the carrier in a plurality of parts of the flexible substrate wherein each part comprises an IC and reduces adhesion between the flexible substrate and the carrier in at least one further portion of the same plurality of parts of the flexible substrate, wherein each part comprises the same IC. In this way, changes in the electromagnetic radiation treatment of selected areas of the flexible substrate provides regions of low adhesion combined with areas of higher adhesion between the flexible substrate and the carrier, allowing for precise control over the overall adhesion of individual ICs to the carrier.

In certain embodiments, focussed infrared (IR) or focussed uv radiation is applied to at least one selected area of the interface between the flexible substrate and the carrier. In this way, adhesion between the flexible substrate and the carrier is reduced in the area to which the focussed IR or focussed uv radiation is applied and the adhesion between the flexible substrate and the carrier is increased in the area immediately adjacent the area to which the focussed IR or focussed uv radiation is applied. The area of increased adhesion may be referred to herein as a welded area.

In certain embodiments, adhesion at the interface between the flexible substrate and the carrier in all but the welded area is then reduced by subsequent application of an unfocussed uv radiation to the entire interface between the flexible substrate and the carrier. In this way, the flexible substrate is released from the carrier in all areas with the exception of the welded areas.

In certain embodiments, the wavelength of the focussed uv radiation is 355 μm.

In certain embodiments, the wavelength of the defocussed uv radiation is 355 μm.

It should be understood that when focussed infrared (IR) or focussed uv radiation is applied to the flexible substrate, the radiation causes ablation of the substrate (thereby reducing adhesion between the flexible substrate and the carrier) in the selected area(s) to which the radiation is directed. Further, when focussed infrared (IR) or focussed uv radiation is applied to the flexible substrate, the adhesion force between the flexible substrate and the carrier is increased in the area immediately adjacent the ablated area, thus forming a welded area.

It should be further understood that when defocussed uv radiation is applied to the interface between the flexible substrate and the carrier, the adhesion force is reduced between the flexible substrate and the carrier in all but the previously welded area(s).

In certain embodiments the flexible substrate material is a polymer. More specifically, the flexible substrate material comprises one or more of polyimide, polyethylene terephthalate (PET) and Polyaryletheretherketone (PEEK)

In certain embodiments, the interface between the carrier and the flexible substrate is formed by direct adhesion of the flexible substrate to the carrier.

In certain embodiments, the interface comprises an interlayer.

In certain embodiments, the interlayer comprises an adhesive. More specifically, the adhesive is one or more of an engineered adhesive which adsorbs electromagnetic radiation at a particular wavelength or a thermally activated adhesive. In certain embodiments, the interlayer comprises an epoxy adhesive.

In certain embodiments, the interlayer comprises titanium metal. In this way, the titanium metal interlayer strongly adsorbs in the ultraviolet (UV) portion of the electromagnetic radiation spectrum and, upon application of an ultraviolet radiation from the source provides a clean release of the flexible substrate from the carrier.

In certain embodiments, the interlayer is patterned. More specifically, the interlayer provides a portion, portions or the whole of the interface between the flexible substrate and the carrier.

In certain embodiments, the interlayer forms the interface between the flexible substrate and the carrier in at least the selected areas.

In certain embodiments, the interlayer forms the interface between the flexible substrate and the carrier along one or more edges of the, or each, IC.

In certain embodiments, the interlayer forms the interface between the flexible substrate and the carrier in the area of the flexible substrate including the, or each, IC and excluding one or more edges of the, or each, IC.

In certain embodiments, the interlayer comprises a primer layer. In the way, in embodiments in which the non-uniform treatment comprises substrate ablation to reduce the adhesion strength between the flexible substrate and the carrier, the primer interlayer provides sufficient adhesion strength to maintain the flexible substrate in contact with the carrier until a transfer process removes the flexible substrate from the carrier.

In certain embodiments the primer layer comprises an adhesion promoter. More specifically, the adhesion promoter is a silane-based material.

In certain embodiments, the flexible substrate is formed of a plurality of die, each comprising an IC. More specifically, the flexible substrate may be cut (e.g. by laser ablation) into a plurality of die each comprising an IC.

In certain embodiments the selected locations may be one or more of: one or more edge(s) of a, or each die, the corners of a, or each die (when the die is polygonal), and a leading and/or trailing edge of a, or each, die.

In certain embodiments, the laser formation process of the individual cut die from the flexible substrate can be modified to create a non-uniform adhesion pattern between the flexible substrate and the carrier.

In certain embodiments, the laser die cutting process is modified to change the adhesion force at one or more edges of each IC die, for example to weld the flexible substrate of the IC die to the carrier at the selected area. More specifically, the electromagnetic radiation source may emit focussed infrared (IR) radiation, causing thermal reduction of the flexible substrate in the selected area to weld the flexible substrate and carrier together. Alternatively, the electromagnetic radiation source may emit focussed ultraviolet (uv) radiation, causing thermal reduction of the flexible substrate in the selected area to weld the flexible substrate and carrier together.

In certain embodiments, the one or more selected locations comprise a portion but not all of the flexible substrate. Yet more specifically, the one or more selected locations comprise a portion but not all of each die of the flexible substrate. In this way, patterning the release process to give non-uniform treatment to the interface between the carrier and the flexible substrate is used.

In certain embodiments, the non-uniform treatment of the flexible substrate with an electromagnetic radiation source (e.g. a laser, flashlamp, high powered LED, an infrared radiation source, an ultraviolet radiation source or the like) comprises avoiding the selected areas, or reducing the power of the electromagnetic radiation emitted by the source in the selected areas, or scanning the electromagnetic radiation across the flexible substrate in a non-step wise manner, thus changing the adhesion profile spatially between the flexible substrate and the carrier.

In certain embodiments, the change in adhesion force is a perforated pattern of consecutive ablation and non- or partial-ablation of the flexible substrate between each die.

In certain embodiments, the wavelength of the electromagnetic radiation is changed to control ablation of the substrate material and/or the interlayer (if present) at the interface between the flexible substrate and the carrier.

In certain embodiments, the electromagnetic radiation emitted by the source is one of: infrared or ultraviolet radiation. More specifically, focussed infrared radiation or ultraviolet radiation is used to increase adhesion force by forming welded areas between the flexible substrate and the carrier immediately adjacent areas of substrate ablation and defocussed ultraviolet radiation is used to reduce adhesion force between the flexible substrate and the carrier. The electromagnetic radiation wavelength is selected according to the material of the flexible substrate and/or the interlayer. In embodiments wherein the non-uniform treatment is substrate ablation of a polyimide, the wavelength may be, for example, 260 µm. In embodiments wherein a titanium interlayer is removed by the non-uniform treatment in the selected areas, ultraviolet radiation between 255 µm and 355 µm is used.

In certain embodiments, the plurality of ICs are arranged as a regular array on the carrier, with a repetition interval of a distance D1 in a first direction. In such embodiments, the non-uniform treatment may change the adhesion force between groups of ICs and the carrier with a treatment repetition interval (distance, period) of n×D1 in the corresponding first direction. Preferably, the groups of ICs released correspond to the IC-engaging features on a transfer device configured to remove the ICs from the carrier and transfer same into contact with contact pads thereby forming an electronic circuit.

In certain embodiments, the transfer device comprises a plurality of IC-engaging features arranged as a regular array on a first roller with a repetition interval (distance, period) of n×D1 in a corresponding first direction, where n is an integer greater than or equal to 2, and the method comprises arranging the carrier at a first position relative to the first roller, changing the adhesion force between the flexible substrate and the carrier for a portion of each of a first group of ICs, picking the first group of the plurality of ICs from the carrier by engaging each IC of that first group with said IC-engaging features, transferring said first group of ICs from the first roller onto the a second roller and into contact with the contact pads.

In certain embodiments, the electromagnetic radiation source is moved relative to a stationary carrier.

In certain embodiments, the carrier is moved relative to a stationary electromagnetic radiation source.

As a result of the present invention, it is possible to retain the positional integrity of diced flexible ICs on a carrier through all handling and shipment procedures, while allowing for direct picking of the flexible ICs directly from the carrier via vacuum head or other process, eliminating the intermediate steps of known processes.

The method of the present invention avoids the requirement for a transfer step of the flexible plastic substrate from the carrier to an adhesive film and the related costs by allowing the pick head to remove individual ICs directly from the carrier on which the flexible ICs are manufactured.

Apparatus arranged to implement a method in accordance with any preceding claim.

According to an aspect of the invention there is provided an apparatus for selectively changing adhesion strength between a flexible substrate and a carrier at one or more selected locations in order to facilitate shipping and subsequent removal of the flexible substrate from the carrier, the apparatus comprising:

a carriage configured (adapted, arranged) to support an assembly comprising a flexible substrate adhered to a carrier and having an interface therebetween, the flexible substrate comprising a plurality of integrated circuits thereon, an electromagnetic radiation source (e.g. a laser, flashlamp, high powered LED, an infrared radiation source, an ultraviolet radiation source or the like) configured (adapted, arranged) to emit electromagnetic radiation of a pre-selected wavelength and to direct same at one or more selected locations of the interface between the flexible substrate and the carrier so as to change the adhesion force between a portion of the flexible substrate and the carrier at the selected location(s).

In certain embodiments, the electromagnetic radiation source is configured (adapted, operable) to emit electromagnetic radiation so as to decrease the adhesion force between a portion of the flexible substrate and the carrier one or more selected location(s).

In certain embodiments, the electromagnetic radiation source is configured (adapted, operable) to emit electromagnetic radiation so as to increase the adhesion force between a portion of the flexible substrate and the carrier one or more selected location(s).

In certain embodiments, the electromagnetic radiation source is one of: a ultraviolet source, an infrared source or the like.

In certain embodiments, the electromagnetic radiation source is a variable power source.

In certain embodiments, the apparatus comprises an electromagnetic screen, configured (adapted, arranged) to block the electromagnetic radiation thereby preventing same from acting on the substrate and/or the interlayer between the substrate and the carrier. In this way, selected areas/locations of substrate are acted upon by the electromagnetic radiation and other areas are protected therefrom.

In certain embodiments, the electromagnetic radiation source is moveable relative to the stationary carriage.

In certain embodiments, the carriage is moveable relative to a stationary electromagnetic radiation source.

BRIEF DESCRIPTION OF THE DRAWINGS

Embodiments of the invention are further described hereinafter with reference to the accompanying drawings, in which.

DETAILED DESCRIPTION

Figure 1:
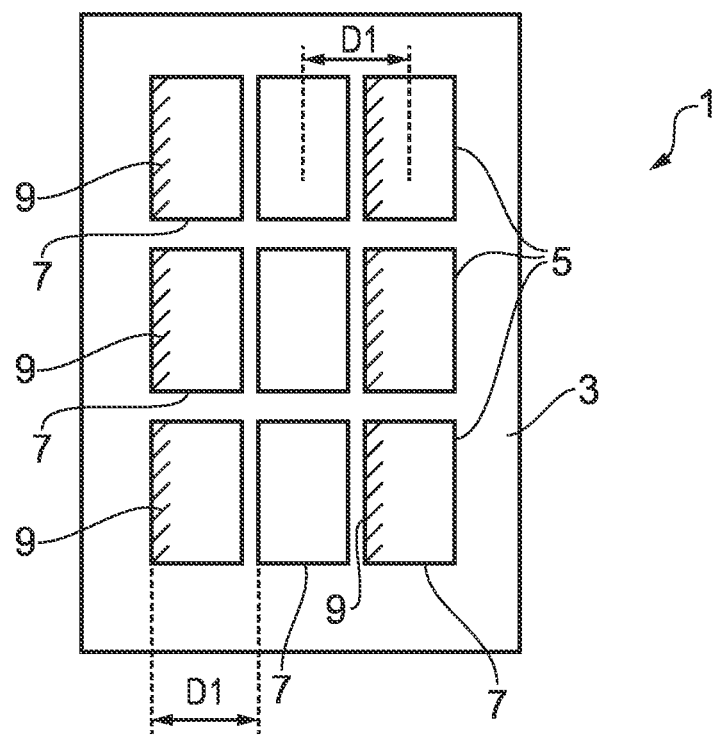
FIG. 1 is a schematic representation of a flexible substrate comprising a plurality of integrated circuits thereon on a glass carrier following the application of a process according to an embodiment of the invention.

FIG. 1 shows an assembly 1 comprising a planar glass carrier 3 having a polyimide flexible substrate 5 thereon. The polyimide substrate 5 comprises a plurality of ICs 7 arranged as a regular array of die on the carrier, with a repetition interval of a distance D1 in a first direction. In the depicted arrangement, the non-uniform laser treatment by infrared radiation from an electromagnetic radiation source (not shown) increases the adhesion force between groups of ICs 7 and the carrier 3 in the selected edge area 9 with a treatment repetition interval (distance, period) of 2×D1 in the corresponding first direction. The treated groups of ICs 7 are adhered to the glass carrier 3 in the treated area 9 with a greater adhesion force than at the remaining interface area of the IC 7. The additional adhesion force in the selected areas 9 of each alternative row of ICs 7 following treatment of the assembly 1, ensures the safe storage and handling of the substrate 5 whilst allowing removal of the ICs 7 from the carrier 3 during a subsequent transfer process.

The treated edge areas 9 in each alternate row of ICs 7 preferably corresponds to the IC-engaging features on a transfer device (not shown) configured to remove the ICs from the carrier and transfer same into contact with contact pads thereby forming an electronic circuit.

Figure 2:
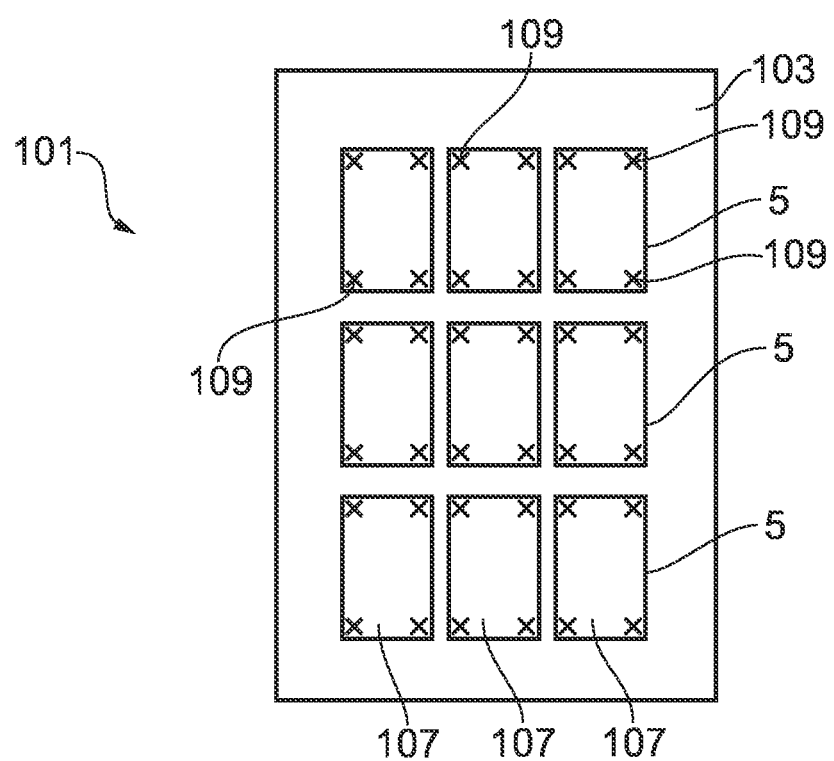
FIG. 2 is a schematic representation of a flexible substrate comprising a plurality of integrated circuits thereon on a glass carrier following the application of a process according to a further embodiment of the invention.

FIG. 2 shows an assembly 101 comprising a planar polycarbonate carrier 103 having a polyimide flexible substrate 5 thereon. The polyimide substrate 5 comprises a plurality of ICs 107 arranged as a regular array of die on the carrier. In the depicted arrangement, the non-uniform laser treatment by infrared radiation from an electromagnetic radiation source (not shown) increases the adhesion force between groups of ICs 107 and the carrier 103 in the selected areas 109. The treated groups of ICs 107 are adhered to the polycarbonate carrier 103 in the treated area 109 with a greater adhesion force than at the remaining interface area of the IC 107. The additional adhesion force in the selected areas 109 of each IC 107 following treatment of the assembly 101, ensures the safe storage and handling of the substrate 5 whilst allowing removal of the ICs 107 from the carrier 103 during a subsequent transfer process.

The treated areas 109 in the depicted arrangement provides a spot of increased adhesion at the interface between the carrier 103 and the substrate 5 at each corner of each IC 107.

Figure 3:
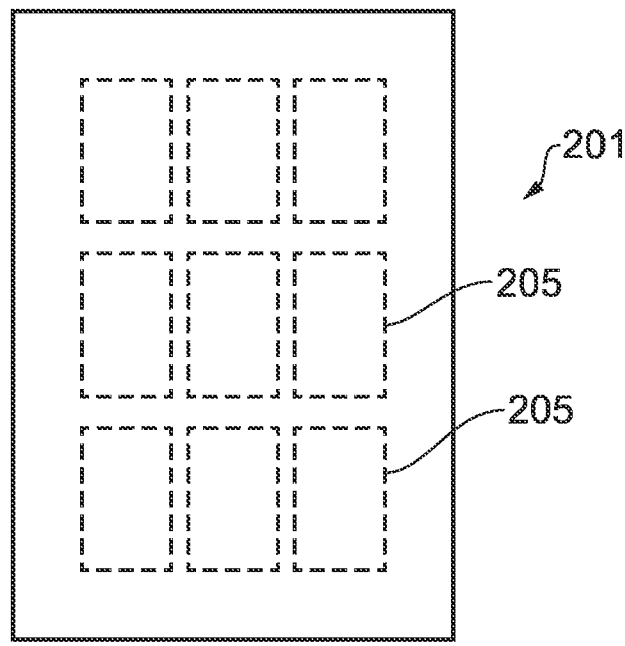
FIG. 3 is a schematic representation of a flexible substrate comprising a plurality of integrated circuits thereon on a carrier following the application of a process according to a further embodiment of the invention.
Figure 4:
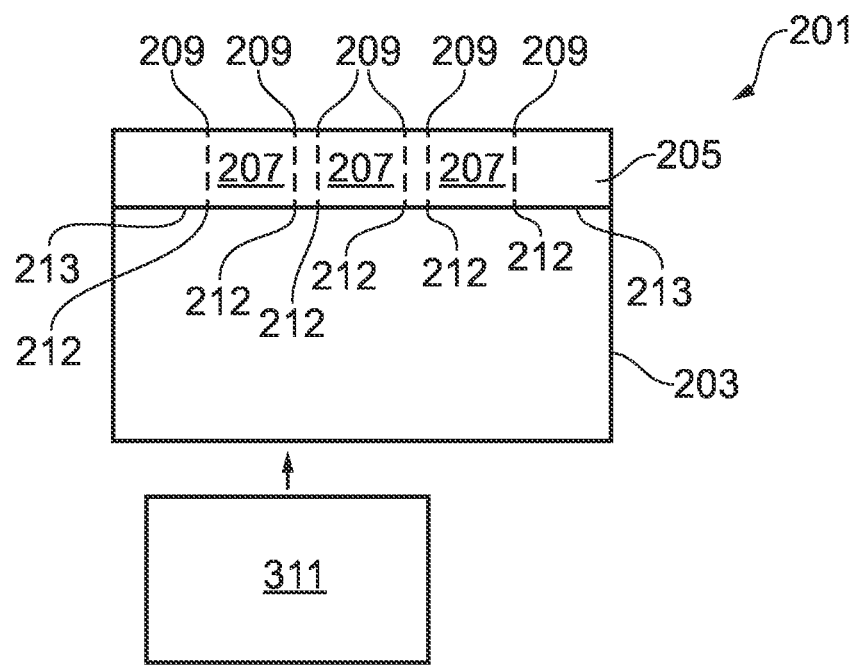
FIG. 4 is a side view of a flexible substrate comprising a plurality of integrated circuits thereon on a carrier following the application of a process according to a further embodiment of the invention.

FIGS. 3 and 4 show an assembly 201, following non-uniform treatment of the flexible polyimide substrate 205 with a focussed ultraviolet radiation source 311 emitting at a wavelength of 260 µm (see FIG. 4). The ultraviolet radiation source 311 may be positioned above the flexible substrate 205 in alternative embodiments (not shown). In this arrangement, the selected areas 209 are the cut lines between each IC 207 on the carrier 203. Carrier 203 is a glass carrier in the depicted arrangement but it should be understood that the carrier 203 could be a flexible release tape in a further embodiment of the invention. During treatment, the focussed ultraviolet radiation is emitted from source 311 in such a way as to consecutively avoid certain parts of the flexible substrate and cause substrate ablation in the selected areas 209 to reduce the adhesion force between the substrate 205 and the carrier 203 at the interface 213. The reduction in adhesion force in the depicted arrangement forms a perforated pattern of areas of consecutive ablation and non-ablation of the flexible substrate 205 between each IC 207. At the same time, the adhesion force between the substrate 205 and the carrier 203 is increased in the areas 212 immediately adjacent the selected areas 209 at the interface between the carrier 203 and the substrate 205. In areas 212, the substrate 205 is welded to the carrier 203 by the focussed uv radiation. Such areas 212 assist in preventing accidental removal of the IC 207 from the carrier 205 during storage and handling but allow release of the IC 207 during a transfer process.

Figure 5A:
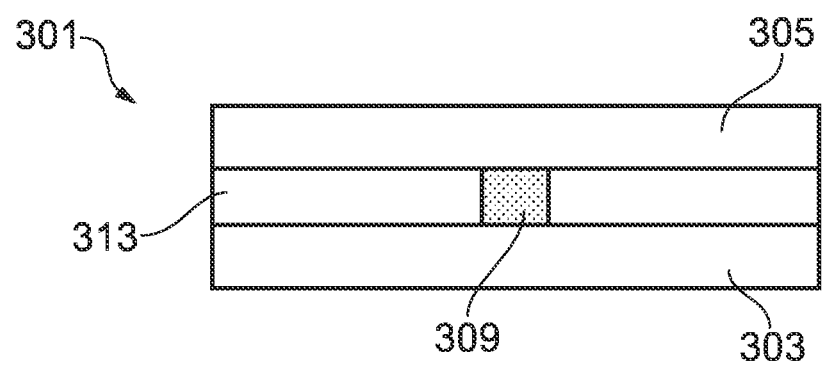
FIG. 5a shows a flexible substrate comprising a plurality of integrated circuits thereon, an interlayer and a glass carrier prior to the application of a process according to a further embodiment of the invention.
Figure 5B:
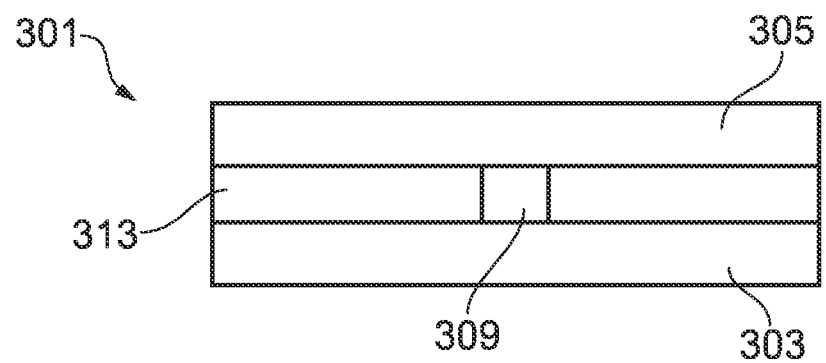
FIG. 5b shows a flexible substrate comprising a plurality of integrated circuits thereon, an interlayer and a glass carrier following the application of a process according to a further embodiment of the invention.
Figure 7A:
FIGS. 7a, 7b and 7c show alternative patterned interlayers between a flexible substrate comprising a plurality of integrated circuits thereon, and a glass carrier prior to the application of a process according to a further embodiment of the invention.
Figure 7B:
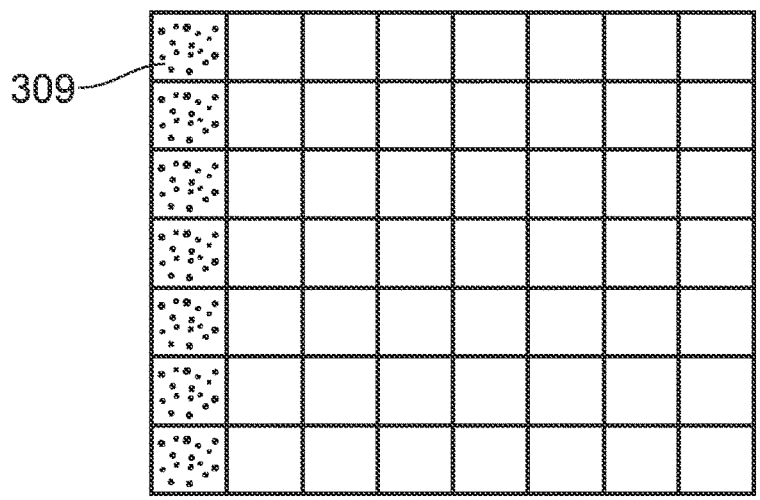
Figure 7C:
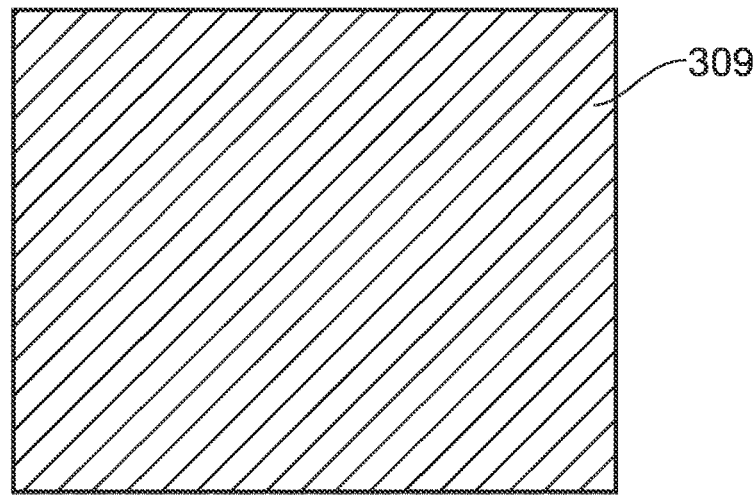

FIGS. 5a and 5b show an assembly 301 before (FIG. 5a) and following (FIG. 5b) by a method according to the invention. Assembly 301 comprises a polyethylene terephthalate (PET) flexible substrate 305 on a quartz carrier 303. An interlayer 313 is provided between the substrate 305 and the carrier 303. Interlayer 313 comprises a selected area 309 in which the interlayer is formed of titanium metal of 10 nm thickness. The remainder of the interlayer 313 is formed of an epoxy adhesive. An electromagnetic radiation source (not shown) emits ultraviolet radiation at a wavelength of 355 μm onto the interlayer 313 in the selected area 309. The titanium metal in the selected area 309 absorbs the ultraviolet radiation thereby reducing the adhesion force between the substrate 305 and the carrier 303 in the selected area 309. In FIGS. 7a, 7b and 7c, the pattern of titanium metal interlayer applied at selected areas 309 changes so as the change the area in which the adhesion force between the carrier 303 and the substrate 305 is reduced. In this way, the release pattern of the substrate 303 from the carrier 305 is controlled by the patterned interlayer 313 and selected areas 309.

Figure 6A:
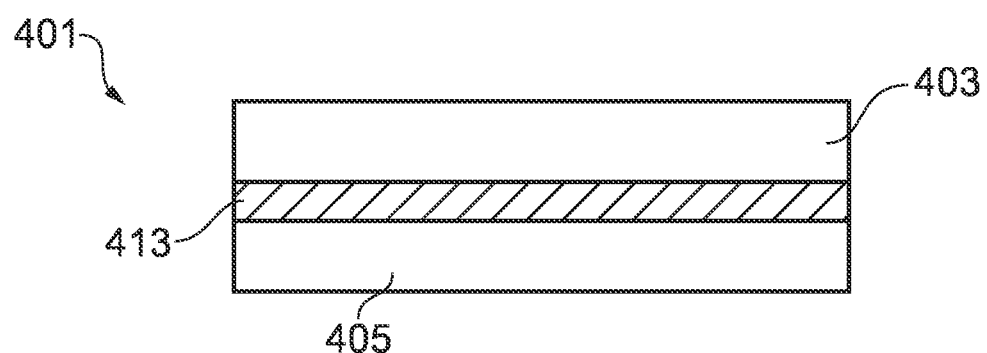
FIG. 6a shows a flexible substrate comprising a plurality of integrated circuits thereon, an interlayer and a glass carrier prior to the application of a process according to a further embodiment of the invention.
Figure 6B:
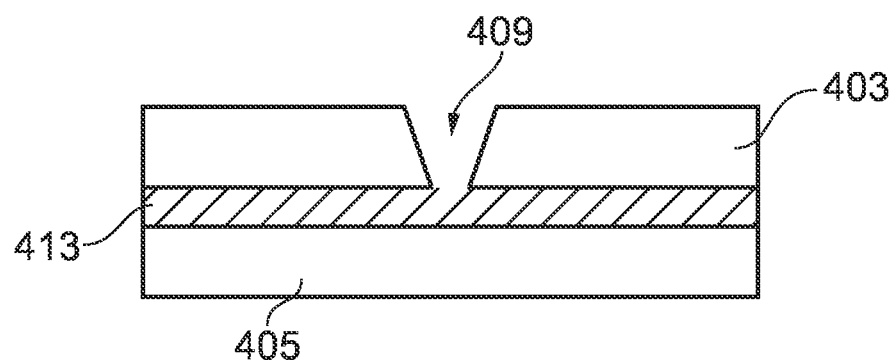
FIG. 6b shows a flexible substrate comprising a plurality of integrated circuits thereon, an interlayer and a glass carrier following the application of a process according to a further embodiment of the invention.

FIGS. 6a and 6b show an assembly 401 before and after treatment according to a method of the invention. The assembly 401 comprises a polyimide substrate 403, a primer interlayer 413 and a glass carrier 405. The substrate 403 is treated in area 409 with ultraviolet radiation at 260 μm wavelength. The substrate 403 in area 409 is ablated by the radiation to reduce the adhesion between the substrate 403 and the carrier 405.

The ultraviolet source (not shown) can be moved across the surface of substrate 403 to provide a line of reduced adhesion force between the substrate 403 and the carrier 405. The power of the ultraviolet source may be altered as the source is moved across the substrate surface so as to cause a pattern of substrate ablation such as that depicted in FIG. 3. It will be understood by the skilled person that the patterned of ablation may be altered according to the desired pattern of reduced adhesion force.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference Below, there is provided a non-exhaustive list of non-limiting aspects. Any one or more of the features of these examples may be combined with any one or more features of another aspect, embodiment or aspect described herein.

Aspects:

1. A process for selectively changing adhesion strength between a flexible substrate, comprising a plurality of electronic components (integrated circuits (ICs)) each comprising a respective group of terminals, and a carrier at specific locations in order to facilitate shipping and subsequent transfer of the flexible substrate, comprising a plurality of electronic components, directly from the carrier onto a respective first portion comprising a respective group of contact pads (contacts), the process comprising the steps of:

providing a flexible substrate comprising a plurality of integrated circuits thereon;

providing a carrier for the flexible substrate and adhering the flexible substrate to the carrier by creating an interface between the flexible substrate and the carrier;

changing the adhesion force between the flexible substrate and the carrier at one or more selected locations by non-uniform treatment of the interface between the flexible substrate and the carrier with an electromagnetic radiation source (e.g. a laser, flashlamp, high powered LED, an infrared radiation source, an ultraviolet radiation source or the like) so as to decrease or increase the adhesion force between a portion of the flexible substrate and the carrier at the selected location(s).

2. A process according to aspect 1, wherein the carrier is rigid.

3. A process according to aspect 1 or aspect 2, wherein the carrier is glass, polycarbonate or quartz.

4. A process according to aspect 1, wherein the carrier is flexible.

5. A process according to aspect 4, wherein the carrier is a flexible release tape.

6. A process according to any one of aspects 1 to 5, wherein the non-uniform treatment reduces the adhesion force between the flexible substrate and the carrier at the selected location(s).

7. A process according to any one of aspect 1 to 5, wherein the non-uniform treatment increases the adhesion force between the flexible substrate and the carrier at the selected location(s).

8. A process according to any one of aspect 1 to 7, wherein the non-uniform treatment reduces the adhesion force between the flexible substrate and the carrier at the selected location(s) and the adhesion force between the flexible substrate and the carrier in the remaining areas (i.e. the untreated areas making up the area other than the selected location(s)) is sufficient to retain contact between the substrate and the carrier during storage and handling and to allow removal of the flexible substrate directly from the carrier during an IC transfer process.

9. A process according to any one of aspects 1 to 7, wherein the non-uniform treatment increases the adhesion force between the flexible substrate and the carrier at the selected location(s) and the adhesion force between the flexible substrate and the carrier in the selected location(s) is sufficient to retain contact between the substrate and the carrier during storage and handling and to allow removal of the flexible substrate from the carrier during an IC transfer process.

10. A process according to aspect 9, wherein following the step of non-uniform treatment of the interface between the flexible substrate and the carrier so as to increase the adhesion force between the flexible substrate and the carrier at the selected location(s), the method further comprises a subsequent step of uniformly treating the interface between the flexible substrate and the carrier with an electromagnetic radiation source (e.g. a laser, flashlamp, high powered LED, an ultraviolet radiation source or the like) so as to decrease the adhesion force between the flexible substrate and the carrier in all remaining areas except the selected location(s).

11. A process according to any one of aspects 1 to 10, wherein the non-uniform treatment increases the adhesion force between the flexible substrate and the carrier in at least one part of the flexible substrate comprising an IC and reduces the adhesion force between the flexible substrate and the carrier in at least one further part of the flexible substrate comprising the same IC.

12. A process according to any one of aspects 1 to 10, wherein the non-uniform treatment of the interface between the flexible substrate and the carrier with an electromagnetic radiation source (e.g. a laser, flashlamp, high powered LED, an infrared radiation source, an ultraviolet radiation source or the like) increases adhesion between the flexible substrate and the carrier in a plurality of parts of the flexible substrate wherein each part comprises an IC and reduces adhesion between the flexible substrate and the carrier in at least one further portion of the same plurality of parts of the flexible substrate, wherein each part comprises the same IC.

13. A process according to any one of the preceding aspects, wherein focussed infrared (IR) or focussed uv radiation is applied to at least one selected area of the interface between the flexible substrate and the carrier.

14. A process according to any one of the preceding aspects, wherein the flexible substrate material is a polymer.

15. A process according to aspect 14, wherein the flexible substrate material comprises one or more of polyimide, polyethylene terephthalate (PET) and Polyaryletheretherketone (PEEK).

16. A process according to any one of the preceding aspects, wherein the interface between the carrier and the flexible substrate is formed by direct adhesion of the flexible substrate to the carrier.

17. A process according to any one of aspects 1 to 15, wherein the interface comprises an interlayer.

18. A process according to aspect 17, wherein the interlayer comprises an adhesive.

19. A process according to aspect 18, wherein the adhesive is one or more of an engineered adhesive which adsorbs electromagnetic radiation at a particular wavelength or a thermally activated adhesive.

20. A process according to aspect 18 or aspect 19, wherein the interlayer comprises an epoxy adhesive.

21. A process according to any one of aspects 17 to 20, wherein the interlayer comprises titanium metal.

22. A process according to any one of aspects 17 to 21, wherein the interlayer is patterned.

23. A process according to aspect 22, wherein the interlayer provides a portion, portions or the whole of the interface between the flexible substrate and the carrier.

24. A process according to any one of aspects 17 to 23, wherein the interlayer forms the interface between the flexible substrate and the carrier in at least the selected areas.

25. A process according to any one of aspects 17 to 24, wherein the interlayer forms the interface between the flexible substrate and the carrier along one or more edges of the, or each, IC.

26. A process according to any one of aspects 17 to 25, wherein the interlayer forms the interface between the flexible substrate and the carrier in the area of the flexible substrate including the, or each, IC and excluding one or more edges of the, or each, IC.

27. A process according to any one of aspects 17 to 26, wherein the interlayer comprises a primer layer.

28. A process according to aspect 27, wherein the primer layer comprises an adhesion promoter.

29. A process according to aspect 28, wherein the adhesion promoter is a silane-based material.

30. A process according to any one of the preceding aspects, wherein the flexible substrate is formed of a plurality of die, each comprising an IC.

31. A process according to aspect 30, wherein flexible substrate is cut (e.g. by laser ablation) into a plurality of die each comprising an IC.

31. A process according to any one of the preceding aspects, wherein the selected locations are one or more of: one or more edge(s) of a, or each die, the corners of a, or each die (when the die is polygonal), and a leading and/or trailing edge of a, or each, die.

33. A process according to aspect 31 or aspect 32, wherein the laser formation process of the individual cut die from the flexible substrate is modified to create a non-uniform adhesion pattern between the flexible substrate and the carrier.

34. A process according to any one of aspects 31 to 33, wherein the laser die cutting process is modified to change the adhesion force at one or more edges of each IC die.

35. A process according to any one of the preceding aspects, wherein the one or more selected locations comprise a portion but not all of the flexible substrate.

36. A process according to any one of the preceding aspects, wherein the one or more selected locations comprise a portion but not all of each die of the flexible substrate.

37. A process according to any one of the preceding aspects, wherein the non-uniform treatment of the flexible substrate with an electromagnetic radiation source (e.g. a laser, flashlamp, high powered LED, an infrared radiation source, an ultraviolet radiation source or the like) comprises avoiding the selected areas, or reducing the power of the electromagnetic radiation emitted by the source in the selected areas, or scanning the electromagnetic radiation across the flexible substrate in a non-step wise manner, thus changing the adhesion profile spatially between the flexible substrate and the carrier.

38. A process according to aspect 37, wherein the change in adhesion force is a perforated pattern of consecutive ablation and non- or partial-ablation of the flexible substrate between each die.

39. A process according to aspect 37 or aspect 38, wherein the wavelength of the electromagnetic radiation is changed to control ablation of the substrate material and/or the interlayer (if present) at the interface between the flexible substrate and the carrier.
40. A process according to any one of the preceding aspects, wherein the electromagnetic radiation emitted by the source is one of: infrared or ultraviolet radiation.
41. A process according to any one of the preceding aspects, wherein focussed infrared radiation or ultraviolet radiation is used to increase adhesion force and defocussed ultraviolet radiation is used to reduce adhesion force between the flexible substrate and the carrier.
42. A process according to any one of the preceding aspects, wherein the plurality of ICs are arranged as a regular array on the carrier, with a repetition interval of a distance D1 in a first direction.
43. A process according to aspect 42, wherein the non-uniform treatment changes the adhesion force between groups of ICs and the carrier with a treatment repetition interval (distance, period) of n×D1 in the corresponding first direction.
44. A process according to any one of the preceding aspects, wherein the flexible substrate material is a polymer.
45. A process according to aspect 44, wherein the flexible substrate material comprises one or more of polyimide, polyethylene terephthalate (PET) and Polyaryletheretherketone (PEEK)
46. A process according to any one of the preceding aspects, wherein the carrier is a glass, polycarbonate or quartz carrier.
47. A process according to any one of the preceding aspects, wherein the electromagnetic radiation source is moved relative to a stationary carrier.
48. A process according to any one of aspects 1 to 46, wherein the carrier is moved relative to a stationary electromagnetic radiation source.
49. Apparatus arranged to implement a method in accordance with any preceding aspects.
50. An apparatus for selectively changing adhesion strength between a flexible substrate and a carrier at one or more selected locations in order to facilitate shipping and subsequent removal of the flexible substrate from the carrier, the apparatus comprising:
a carriage configured (adapted, arranged) to support an assembly comprising a flexible substrate adhered to a carrier and having an interface therebetween, the flexible substrate comprising a plurality of integrated circuits thereon, an electromagnetic radiation source (e.g. a laser, flashlamp, high powered LED, an infrared radiation source, an ultraviolet radiation source, or the like) configured (adapted, arranged) to emit electromagnetic radiation of a pre-selected wavelength and to direct same at one or more selected locations of the interface between the flexible substrate and the carrier so as to change the adhesion force between a portion of the flexible substrate and the carrier at the selected location(s).
51. An apparatus according to aspect 50, wherein the electromagnetic radiation source is configured (adapted, operable) to emit electromagnetic radiation so as to decrease the adhesion force between a portion of the flexible substrate and the carrier one or more selected location(s).
52. An apparatus according to aspect 50, wherein the electromagnetic radiation source is configured (adapted, operable) to emit electromagnetic radiation so as to increase the adhesion force between a portion of the flexible substrate and the carrier one or more selected location(s).
53. An apparatus according to any one of aspects 50 to 52, wherein the electromagnetic radiation source is one of: a ultraviolet source, an infrared source or the like.
54. An apparatus according to any one of aspects 50 to 53, wherein the electromagnetic radiation source is a variable power source.
55. An apparatus according to any one of aspects 50 to 54, wherein the apparatus comprises an electromagnetic screen, configured (adapted, arranged) to block the electromagnetic radiation thereby preventing same from acting on the substrate and/or the interlayer between the substrate and the carrier. In this way, selected areas/locations of substrate are acted upon by the electromagnetic radiation and other areas are protected therefrom.
56. An apparatus according to any one of aspects 50 to 55, wherein the electromagnetic radiation source is moveable relative to the stationary carriage.
57. An apparatus according to any one of aspects 50 to 55, wherein the carriage is moveable relative to a stationary electromagnetic radiation source.

The invention claimed is:

1. A process that selectively changes adhesion strength between a flexible substrate that includes a plurality of integrated circuits (ICs), each of the plurality of integrated circuits comprising a respective group of terminals, and a carrier at specific locations, the process comprising:
providing the carrier with the flexible substrate, comprising the plurality of ICs thereon, adhered to the carrier so as to create an interface between the flexible substrate and the carrier;
increasing an adhesion force between the flexible substrate and the carrier at one or more selected locations by non-uniform treatment of the interface between the flexible substrate and the carrier with a focussed electromagnetic radiation source; and
following the non-uniform treatment of the interface between the flexible substrate and the carrier with the focussed electromagnetic radiation source, uniformly treating the interface between the flexible substrate and the carrier with an unfocussed electromagnetic radiation source to decrease the adhesion force between the flexible substrate and the carrier.

2. The process according to claim 1, wherein the non-uniform treatment increases the adhesion force between the flexible substrate and the carrier in at least one part of the flexible substrate comprising one IC of the plurality of ICs and reduces the adhesion force between the flexible substrate and the carrier in at least one further part of the flexible substrate comprising the one IC, or wherein the non-uniform treatment of the interface between the flexible substrate and the carrier increases adhesion between the flexible substrate and the carrier in a plurality of parts of the flexible substrate wherein each part comprises one IC of the plurality of ICs and reduces adhesion between the flexible substrate and the carrier in at least one further portion of the same plurality of parts of the flexible substrate, wherein each part of the plurality parts of the flexible substrate comprises the one IC.

3. The process according to claim 1, wherein the interface comprises an interlayer.

4. The process according to claim 3, wherein the interlayer comprises at least one: an epoxy adhesive; titanium metal; an adhesive, wherein the adhesive is one or more of an engineering adhesive which adsorbs electromagnetic radiation at a particular wavelength or a thermally activated adhesive; and a primer layer, wherein the primer layer comprises an adhesion promoter, and wherein the adhesion promoter is a silane-based material.

5. The process according to claim 3, wherein the interlayer is partially patterned, and the interlayer provides a portion, portions, or a whole of the interface between the flexible substrate and the carrier.

6. The process according to claim 3, wherein the interlayer forms at least one of: the interface between the flexible substrate and the carrier in at least the selected locations; the interface between the flexible substrate and the carrier along one or more edges of each, IC; the interface between the flexible substrate and the carrier in the area of the flexible substrate including each, IC and excluding one or more edges of each, IC.

7. The process according to claim 1, wherein the flexible substrate is formed of a plurality of die, each comprising an IC, and wherein the flexible substrate is cut into a plurality of die each comprising an IC.

8. The process according to claim 1, wherein the one or more selected locations comprise a portion but not all of each die of the flexible substrate.

9. The process according to claim 1, wherein the non-uniform treatment of the flexible substrate with the focused electromagnetic radiation source comprises:
  avoiding the one or more selected locations,
  reducing the power of the electromagnetic radiation in the selected locations, or
  scanning the electromagnetic radiation source across the flexible substrate in a non-step wise manner, thus changing the adhesion profile between the flexible substrate and the carrier, and, wherein the change in the adhesion force is realized through a perforated pattern of consecutive ablation and non- or partial-ablation of the flexible substrate between each die, and, wherein the wavelength of the electromagnetic radiation is changed to control at least one of an ablation of the substrate material and the interlayer at the interface between the flexible substrate and the carrier.

10. The process according to claim 1, wherein the providing step further comprises:
  arranging the plurality of ICs in a regular array on the carrier, with a repetition interval of a distance D1 in a first direction, and wherein the non-uniform treatment changes the adhesion force between groups of the plurality of ICs and the carrier with a treatment repetition interval based on the expression n×D1 in the corresponding first direction wherein n is an integer greater than or equal to 2.

11. The process according to claim 1, wherein the one or more selected locations are at least one of:
  edges, of a die,
  edges of each die,
  corners of a die,
  corners of each die,
  a leading edge of a die,
  a leading edge of each die,
  a trailing edge of a die, and
  a trailing edge of each die.

12. An apparatus for selectively changing adhesion strength between a flexible substrate and a carrier at specific locations, the apparatus comprising:
  a carriage configured to support an assembly comprising the flexible substrate adhered to the carrier and having an interface therebetween, the flexible substrate comprising a plurality of integrated circuits (ICs) thereon,
  a focussed electromagnetic radiation source configured to emit focussed electromagnetic radiation of a pre-selected wavelength to non-uniformly treat the interface between the flexible substrate and the carrier to increase an adhesion force between the flexible substrate and the carrier at one or more selected location;
  and an unfocussed electromagnetic radiation source configured to emit unfocussed electromagnetic radiation to uniformly treat the interface between the flexible substrate and the carrier to decrease the adhesion force between the flexible substrate and the carrier in all areas following the non-uniform treatment of the interface between the flexible substrate and the carrier.

* * * * *